United States Patent
Liu et al.

(10) Patent No.: US 7,528,466 B2
(45) Date of Patent: May 5, 2009

(54) COPPER GATE ELECTRODE OF LIQUID CRYSTAL DISPLAY DEVICE AND METHOD OF FABRICATING THE SAME

(75) Inventors: Yu-Wei Liu, Shulin (TW); Wen-Ching Tsai, Yilan County (TW); Kuo-Yu Huang, Hsinchu County (TW); Hui-Fen Lin, Yunlin County (TW)

(73) Assignee: AU Optronics Corp., Hsin-Chu (TW)

( * ) Notice: Subject to any disclaimer, the term of this patent is extended or adjusted under 35 U.S.C. 154(b) by 509 days.

(21) Appl. No.: 11/178,436

(22) Filed: Jul. 12, 2005

(65) Prior Publication Data
US 2006/0138659 A1 Jun. 29, 2006

(30) Foreign Application Priority Data
Dec. 29, 2004 (TW) ............................... 93141259 A

(51) Int. Cl.
*H01L 21/20* (2006.01)
(52) U.S. Cl. .................. 257/642; 257/40; 257/436; 257/532; 257/E21.025; 257/E21.139; 257/E21.347; 257/E21.413; 257/E21.703; 257/E29.278; 257/E29.282
(58) Field of Classification Search ............ 257/40, 257/436, 532, 642, E21.025, 134, 279, 347, 257/413, 703, E29.278, 282
See application file for complete search history.

(56) References Cited

U.S. PATENT DOCUMENTS

| 5,695,810 | A | * | 12/1997 | Dubin et al. ................. 438/643 |
| 6,794,220 | B2 | * | 9/2004 | Hirai et al. .................... 438/99 |
| 6,802,985 | B1 | | 10/2004 | Chikama et al. |
| 7,279,777 | B2 | * | 10/2007 | Bai et al. ..................... 257/642 |
| 7,323,368 | B2 | * | 1/2008 | Takayama et al. ........... 438/149 |
| 2003/0038594 | A1 | * | 2/2003 | Seo et al. ..................... 313/506 |
| 2003/0162412 | A1 | * | 8/2003 | Chung ........................ 438/791 |
| 2003/0233960 | A1 | | 12/2003 | Grunwald |
| 2004/0125257 | A1 | | 7/2004 | Chae et al. |
| 2006/0060834 | A1 | * | 3/2006 | Hirai ........................... 257/40 |

FOREIGN PATENT DOCUMENTS

JP 08-248442 9/1996

\* cited by examiner

*Primary Examiner*—Michael S Lebentritt
(74) *Attorney, Agent, or Firm*—Bacon & Thomas, PLLC

(57) ABSTRACT

A copper gate electrode, applied in a thin-film-transistor liquid crystal display (LCD) device, at least comprises a patterned copper layer formed on a glass substrate, and a barrier layer formed on the patterned copper layer. The barrier layer comprises at least one of nitrogen and phosphorus, or comprises an alloy formularized as $M_1M_2R$ wherein $M_1$ is cobalt (Co) or molybdenum (Mo), $M_2$ is tungsten (W), molybdenum (Mo), rhenium (Re) or vanadium (V), and R is boron (B) or phosphorus (P).

12 Claims, 3 Drawing Sheets

COPPER GATE ELECTRODE OF LIQUID CRYSTAL DISPLAY DEVICE AND METHOD OF FABRICATING THE SAME

This application claims the benefit of Taiwan application Serial No. 93141259, filed Dec. 29, 2004, the subject matter of which is incorporated herein by reference.

BACKGROUND OF THE INVENTION

1. Field of the Invention

The invention relates in general to a copper gate electrode of liquid crystal display device and method of fabricating the same, and more particularly to the copper gate electrode having a barrier layer and the method of fabricating the same.

2. Description of the Related Art

The thin film transistor liquid crystal displays ("TFT-LCD"), having the TFTs arranged in an array and the electrical components (i.e. capacitors, drivers), are capable of displaying the vivid images. With the advantages of handy size, light weight, low power consumption and no radiation contamination, the TFT-LCDs have been widely used in the world. In the commercial market, the TFT-LCD applications include the portable products such as personal digital assistants (PDA), regular size products such as monitors of laptop or desktop computers, and large size products such as 30"~40" LCD-TVs.

Conventionally, the gate electrode of the TFT-LCD is made of aluminum alloy. However, the material with higher conductivity is required for the larger-size and high-resolution TFT-LCD, to minimize the wire RC delay. The materials commonly used as the conductive wire include copper (Cu, electric resistance $1.7 \times 10^{-6}$ Ωcm), aluminum (Al, electric resistance $2.6 \times 10^{-6}$ Ωcm), titanium (Ti, electric resistance $41.6 \times 10^{-6}$ Ωcm), Molybdenum (Mo, electric resistance $5.7 \times 10^{-6}$ Ωcm), chromium (Cr, electric resistance $12.8 \times 10^{-6}$ Ωcm) and nickel (Ni, electric resistance $6.8 \times 10^{-6}$ Ωcm). Thus, aluminum alloy replaced by copper has been developed in the recent years.

FIG. 1 illustrates a cross-sectional view of a partial structure of a conventional TFT-LCD. A copper layer is sputtered on a transparent glass substrate 101, and the copper layer is etched to form a patterned copper layer (i.e. as the gate electrode of the TFT-LCD) 103 by photolithography. It is a need for the patterned copper layer 103 to have the appropriate taper angles in the sidewalls. Afterward, a silicon nitride layer 105, an a-Si (amorphous silicon) layer 107 and a n+ a-Si layer 109 are laminated above the patterned copper layer 103.

Although copper possesses a good conductivity, the conventional process of fabricating the conductive wires (i.e. gate electrode) using copper still has several problems to be solved. For example, surface oxidization quickly occurs and it is not easy to control the taper angle of the patterned copper layer due to the difficulty of copper etch. The adhesion strength between the patterned copper layer 103 and the glass substrate 101 is weak, so is the adhesion between the patterned copper layer 103 and the silicon nitride layer 105. If the patterned copper layer 103 directly contacts with the silicon nitride layer 105, copper quickly reacts with silicon to produce $Cu_3Si$ so as to change the electrical properties of the applied device (i.e. TFT-LCD). Also, copper diffused into the silicon nitride layer 105 deteriorates the insulation property of silicon nitride so as to increase the current leakage. Moreover, the bare patterned copper layer is reactive in the sequential process such as plasma enhanced chemical vapor deposition (PECVD) or dry etching process; thus, it is easy to contaminate the processing machine so as to degrade the quality of the applied device.

Some attempts have been made for solving the problems listed above. The first attempt is to dispose at least one metal layer between the patterned copper layer 103 and the silicon nitrite layer 105 to solve the problems of weak adhesion, reactivity and diffusion between copper and silicon. The metal layer could be made of tantalum nitride (TaN)-titanium nitride (TiN)-aluminum nitride (AlN)-aluminum oxide ($Al_2O_3$)-titanium oxide ($TiO_2$)-tantalum (Ta)-molybdenum (Mo)-chromium (Cr)-titanium (Ti)-tungsten (W) and nickel (Ni). However, additional steps such as deposition, developing and etching are required for forming this metal layer. The second attempt is to use the copper alloy such as an alloy of copper and chromium ($Cu_{1-x}Cr_x$), or an alloy of copper and magnesium ($Cu_{1-x}Mg_x$) as the material of the patterned copper layer 103. Also, the thermal oxidation is applied to form chromium oxide ($Cr_2O_3$) or magnesium oxide (MgO) on the surface of the patterned copper layer 103 for solving the problems of weak adhesion, reactivity and diffusion between copper and silicon. Similarly, the second attempt requires extra steps such as metal deposition, developing, etching and thermal oxidation during the fabrication. The third attempt is to dispose an indium tin oxide (ITO) layer between the patterned copper layer 103 and the transparent glass substrate 101 for solving the problem of weak adhesion between the copper and glass.

Moreover, the improper taper angle of patterned copper layer causes the impact of film coverage of post processes, and therefore the yield of production is decreased. The three attempts discussed above cannot control the taper angle of patterned copper layer; a need still exists for a method of obtaining a proper taper angle.

SUMMARY OF THE INVENTION

It is therefore an object of the invention to provide a copper gate electrode of liquid crystal display device and method of fabricating the same. By applied a barrier layer on the patterned copper layer, the adhesion strength between the copper and silicon is increased and the diffusion from copper to silicon is prevented, so as to enhance the electrical properties of the applied product.

The invention achieves the objects by providing a copper gate electrode applied in a thin film transistor liquid crystal displays (TFT-LCD). The copper gate electrode at least comprises a patterned copper layer formed on a glass substrate, and a barrier layer formed on the patterned copper layer. The barrier layer comprises at least one of nitrogen and phosphorus, or comprises an alloy formularized as $M_1M_2R$ wherein $M_1$ is cobalt (Co) or molybdenum (Mo), $M_2$ is tungsten (W), molybdenum (Mo), rhenium (Re) or vanadium (V), and R is boron (B) or phosphorus (P).

The invention achieves the objects by providing a method of fabricating copper gate electrode, comprising the steps of providing a glass substrate; forming a copper layer on the glass substrate; defining the copper layer to form a patterned copper layer; and forming a barrier layer on the patterned copper layer for covering the patterned copper layer; wherein the barrier layer comprises at least one of nitrogen and phosphorus, or comprises an alloy formularized as $M_1M_2R$ wherein M1 is cobalt (Co) or molybdenum (Mo), M2 is tungsten (W), molybdenum (Mo), rhenium (Re) or vanadium (V), and R is boron (B) or phosphorus (P). Also, the barrier layer comprising at least one of nitrogen and phosphorus (e.g.

polysilane) could be formed by coating. The barrier layer comprising an alloy formularized as $M_1M_2R$ could be formed by electroless plating.

Other objects, features, and advantages of the invention will become apparent from the following detailed description of the preferred but non-limiting embodiments. The following description is made with reference to the accompanying drawings.

DETAILED DESCRIPTION OF THE INVENTION

In the present invention, a barrier layer is formed on the patterned copper layer, thereby solving the problems of weak adhesion, reactivity and diffusion between copper and silicon. The barrier layer comprises at least one of nitrogen and phosphorus, or comprises an alloy formularized as $M_1M_2R$ wherein $M_1$ is cobalt (Co) or molybdenum (Mo), $M_2$ is tungsten (W), molybdenum (Mo), rhenium (Re) or vanadium (V), and R is boron (B) or phosphorus (P).

The first and second embodiments disclosed herein, having a barrier layer in the applied product (e.g. TFT-LCD), are for illustrating the invention, but not for limiting the scope of the invention. Also, an adhesion layer is preferably formed between the glass substrate and the patterned copper layer in the first and second embodiments for enhancing the adhesion strength between the glass and copper. The adhesion layer could be made of metal, or polymer containing nitrogen, silicon or the mixture. Additionally, the drawings used for illustrating the embodiments of the invention only show the major characteristic parts in order to avoid obscuring the invention. Accordingly, the specification and the drawings are to be regard as an illustrative sense rather than a restrictive sense.

First Embodiment

Figure 1:
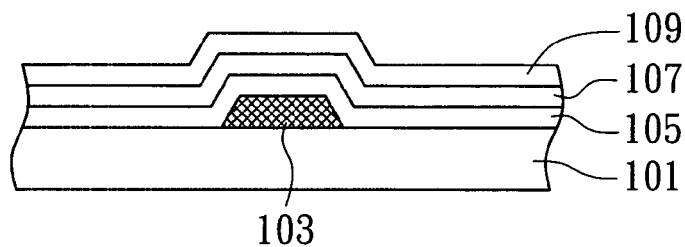
FIG. 1 (related art) illustrates a cross-sectional view of a partial structure of a conventional TFT-LCD.
Figure 2A:
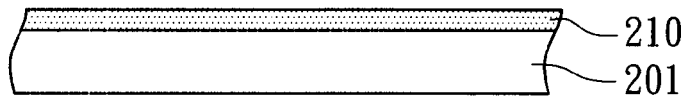
FIG. 2A~FIG. 2E illustrate a partial process for fabricating a TFT-LCD according to the first embodiment of the invention.

FIG. 2A~FIG. 2E illustrate a partial process for fabricating a TFT-LCD according to the first embodiment of the invention. First, a glass substrate 201 pre-cleaned by deionized water is provided. An adhesion layer 210 is preferably formed on the glass substrate 201, as shown in FIG. 2A. The adhesion layer 210 could be formed by spin coating or spinless coating. The material of the adhesion layer 210 is the polymer comprising at least one of nitrogen and phosphorus, such as polysilane (with high transparency and thermal stability), photosensitive methylsilazane (PS-MSZ) and non-photosensitive MSZ (available from Clariant Cop.) The thickness of the adhesion layer 210 is ranged from about 100 nm to about 3000 nm.

Figure 2B:
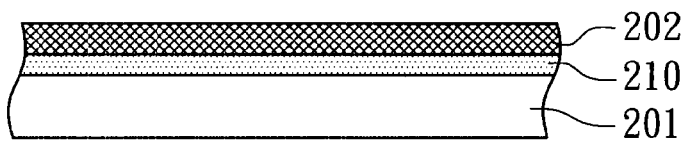
Figure 2C:
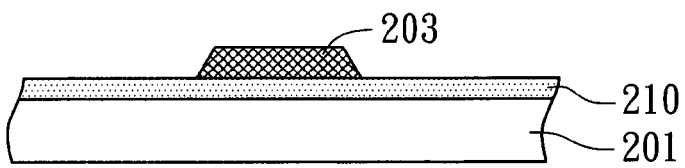

Then, a copper layer 202 is formed (e.g. sputtered) on the adhesion layer 210, as shown in FIG. 2B. The copper layer 202 is then defined (i.e. patterned) by photolithography. For example, a photo-resist (PR) layer is formed above the copper layer 202, and the PR layer is exposed and developed to form a PR pattern. The copper layer 202 is then etched according to the PR pattern to form a patterned copper layer 203; finally, the PR pattern is removed, as shown in FIG. 2C. In the applied product (e.g. TFT-LCD), the patterned copper layer 203 could be formed as the gate electrode.

Afterward, a barrier layer could be preferably formed for covering the patterned copper layer 203. The barrier layer is a polymer comprising at least one of nitrogen and phosphorus (such as polysilane), or an alloy formularized as $M_1M_2R$ wherein $M_1$ is cobalt (Co) or molybdenum (Mo), $M_2$ is tungsten (W), molybdenum (Mo), rhenium (Re) or vanadium (V), and R is boron (B) or phosphorus (P). In the first embodiment, a barrier layer comprising at least one of nitrogen and phosphorus is taken for illustration.

Figure 2D:
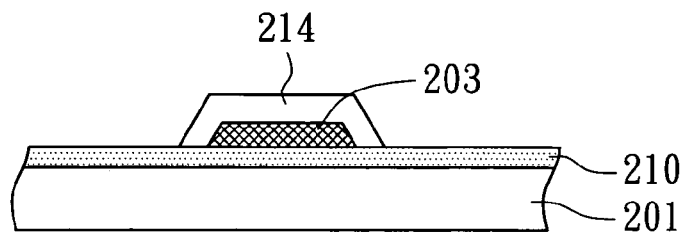

As shown in FIG. 2D, a barrier layer 214 is formed on the patterned copper layer 203 in the first embodiment. The technique of spin coating or spinless coating could be used in the formation of the barrier layer 214. The material of the barrier layer 214 is the polymer comprising at least one of nitrogen and phosphorus, such as polysilane (with high transparency and thermal stability), photosensitive methylsilazane (PS-MSZ) and non-photosensitive MSZ (available from Clariant Cop.) The thickness of the barrier layer 214 is about 100 nm to about 3000 nm, and preferably about 500 nm to about 3000 nm.

Figure 2E:
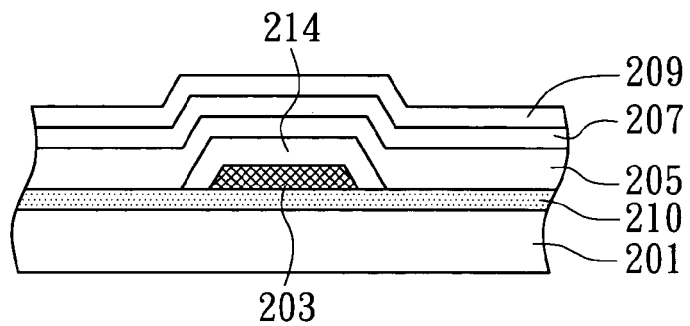

The sequential processes such as formation of a silicon nitrite layer 205, an a-Si (amorphous silicon) layer 207 and an n+ a-Si layer 209 are performed to stack above the barrier layer 214, as shown in FIG. 2E.

Additionally, the adhesion layer 210 could be the metallic material selected from the group consisting of molybdenum (Mo), tungsten (W), molybdenum tungsten (MoW), chromium (Cr), tantalum (Ta), titanium (Ti), titanium nitride (TiN), titanium tungsten (TiW), rhodium (Rh), rhenium (Re), ruthenium (Ru) and cobalt (Co). This conductive adhesion layer 210 is formed in a thickness of about 20 nm to about 200 nm (FIG. 2A) by sputtering.

Second Embodiment

Figure 3A:
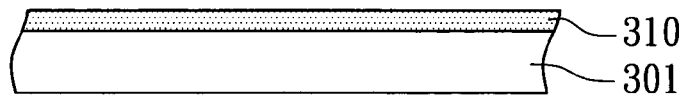
FIG. 3A~FIG. 3G illustrate a partial process for fabricating a TFT-LCD according to the second embodiment of the invention.

FIG. 3A~FIG. 3G illustrate a partial process for fabricating a TFT-LCD according to the second embodiment of the invention. First, a glass substrate 301 pre-cleaned by deionized water is provided. Then, an adhesion layer 310 is preferably formed on the glass substrate 301, as shown in FIG. 3A. The technique of spin coating or spinless coating could be used in the formation of the adhesion layer 310. The material of the adhesion layer 310 is the polymer comprising at least one of nitrogen and phosphorus, such as polysilane (with high transparency and thermal stability), photosensitive methylsilazane (PS-MSZ) and non-photosensitive MSZ (available from Clariant Cop.) The thickness of the adhesion layer 310 is preferably ranged from about 100 nm to about 3000 nm.

Figure 3B:
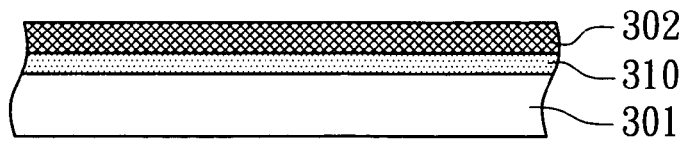
Figure 3C:
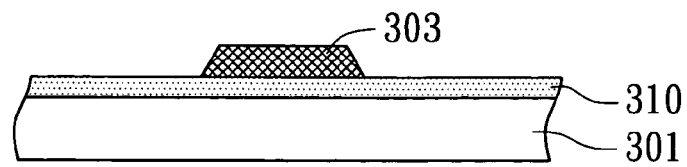

Then, a copper layer 302 is formed (e.g. sputtered) on the adhesion layer 310, as shown in FIG. 3B. The copper layer 302 is patterned by photolithography. For example, a photo-resist (PR) layer is formed above the copper layer 302, and the PR layer is exposed and developed to form a PR pattern. The copper layer 302 is then etched according to the PR pattern to form a patterned copper layer 303; finally, the PR pattern is stripped, as shown in FIG. 3C.

Figure 3D:
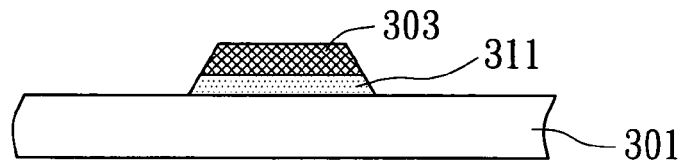

Next, the adhesion layer 310 is patterned (e.g. dry-etched) according to the patterned copper layer 303, to create a patterned adhesion layer 311 as shown in FIG. 3D.

Afterward, a barrier layer could be preferably formed for covering the patterned copper layer 303. The barrier layer is a polymer comprising at least one of nitrogen and phosphorus (such as polysilane), or an alloy formularized as $M_1M_2R$ wherein $M_1$ is cobalt (Co) or molybdenum (Mo), $M_2$ is tungsten (W), molybdenum (Mo), rhenium (Re) or vanadium (V), and R is boron (B) or phosphorus (P). In the second embodiment, a barrier layer comprising an alloy formularized as $M_1M_2R$ is taken for illustration.

Figure 3E:
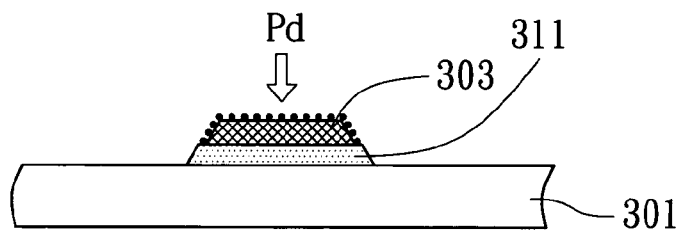

As shown in FIG. 3E, activated reaction 303 is performed at the patterned copper layer before the formation of the barrier layer. For example, displacement reaction using palladium (Pd) is applied to activate the surface of the patterned copper layer 303.

Figure 3F:
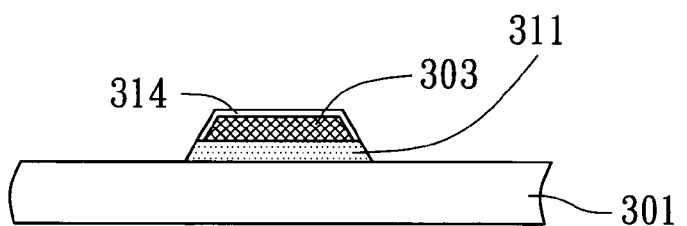

Afterward, a barrier layer 314 is formed on the patterned copper layer 303 by electroless plating, as shown in FIG. 3F. The thickness of the barrier layer 314 is preferably ranged from about 5 nm to about 50 nm. The barrier layer is an alloy formularized as $M_1M_2R$ wherein $M_1$ is cobalt (Co) or molybdenum (Mo), $M_2$ is tungsten (W), molybdenum (Mo), rhenium (Re) or vanadium (V), and R is boron (B) or phosphorus (P). Practically, the glass substrate 301 comprising the patterned copper layer 303 is immersed into a selected solution (e.g. Co-solution), so as to form the barrier layer (e.g. a film of Co, CoWP, NiWP, etc.) 314 by electroless plating.

Figure 3G:
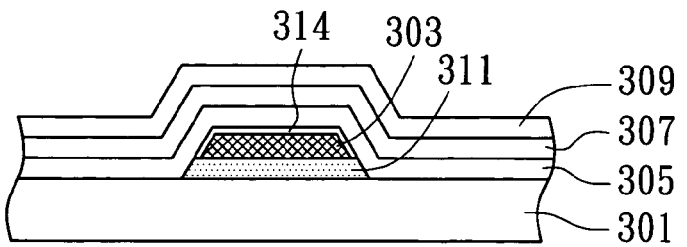

The sequential processes such as formation of a silicon nitrite layer 305, an a-Si (amorphous silicon) layer 307 and an n+ a-Si layer 309 are performed (e.g. by plasma enhanced chemical vapor deposition (PECVD)) to stack above the barrier layer 314, as shown in FIG. 3G.

Additionally, the adhesion layer 310 could be the metallic material selected from the group consisting of molybdenum (Mo), tungsten (W), molybdenum tungsten (MoW), chromium (Cr), tantalum (Ta), titanium (Ti), titanium nitride (TiN), titanium tungsten (TiW), rhodium (Rh), rhenium (Re), ruthenium (Ru) and cobalt (Co). This conductive adhesion layer 310 is formed in a thickness of about 20 nm to about 200 nm (FIG. 3A) by sputtering, and is then etched to form the patterned adhesion layer 311 (FIG. 3D).

According to the first and second embodiments, the barrier layers 214 and 314 are formed before the deposition of the silicon nitrite layers 205 and 305. The barrier layer could be a polymer layer coated in a thickness of about 100 nm to about 3000 nm and comprising at least one of nitrogen and phosphorus (e.g. polysilane, photosensitive methylsilazane (PS-MSZ) and non-photosensitive MSZ (available from Clariant Cop.)); or an alloy formularized as $M_1M_2R$ and formed in a thickness of about 5 nm to about 50 nm by electroless plating.

According to the aforementioned descriptions, the barrier layer not only functions as a planarized layer but also prevents the patterned copper layer from being exposed and oxidized. Moreover, the barrier layer prevents the patterned copper layer from contamination in the processing machines during the sequential processes (e.g. deposition of SiN/a-Si/n+ a-Si by PECVD, or dry etching).

If a polymer layer comprising at least one of nitrogen and phosphorus is selected as the barrier layer, photolithography (i.e. steps of deposition, developing and etching), a complicated and expansive process, can be replaced by the technique of spin coating or spinless coating, thereby decreasing the production cost. If the barrier layer is made of polysilane, the applied product has good optical property and reliability due to high transparency and thermal stability of polysilane; therefore, the taper angle tolerance during copper etch is increased.

If an alloy formularized as $M_1M_2R$ is selected to be the barrier layer, it functions not only as the etch stop layer but also as a conductive layer for electrically connecting the patterned copper layer and other conductive wires. Moreover, conventional photolithography (i.e. steps of deposition, developing and etching), a complicated and expansive process, can be replaced by the technique of electroless plating for forming the $M_1M_2R$ barrier layer, thereby decreasing the production cost.

While the invention has been described by way of examples and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A copper gate electrode for a thin film transistor liquid crystal display (TFT-LCD), comprising:
    a patterned copper layer formed on a substrate; and
    a barrier layer, formed on the patterned copper layer, and the barrier layer comprising phosphorus.

2. The copper gate electrode according to claim 1, wherein a thickness of the barrier layer ranges from about 500 nm to about 3000 nm.

3. The copper gate electrode according to claim 1 further comprising an adhesion layer formed between the patterned copper layer and the substrate.

4. The copper gate electrode according to claim 3, wherein the adhesion layer is substantially made of methylsilazane (MSZ), and a thickness of the adhesion layer is ranged from about 1000 nm to about 3000 nm.

5. The copper gate electrode according to claim 1 further comprising a silicon nitrite layer, an amorphous silicon (a-Si) layer and an n+ a-Si layer laminated over the barrier layer.

6. A copper gate electrode for a thin film transistor liquid crystal display (TFT-LCD), comprising:
    a patterned copper layer formed on a substrate; and
    a barrier layer, formed on the patterned copper layer, and the barrier layer comprising an alloy of $M_1M_2R$ wherein $M_1$ is molybdenum (Mo), $M_2$ is tungsten (W), molybdenum (Mo), rhenium (Re) or vanadium (V), and R is boron (B) or phosphorus (P).

7. The copper gate electrode according to claim 6, wherein the barrier layer has a thickness ranged from about 5 nm to about 50 nm.

8. The copper gate electrode according to claim 6 further comprising an adhesion layer formed between the patterned copper layer and the substrate.

9. The copper gate electrode according to claim 8, wherein the adhesion layer is substantially made of methylsilazane (MSZ), and a thickness of the adhesion layer is ranged from about 1000 nm to about 3000 nm.

10. The copper gate electrode according to claim 6 further comprising a silicon nitrite layer, an amorphous silicon (a-Si) layer and an n+a-Si layer laminated over the barrier layer.

11. A copper gate electrode for a thin film transistor liquid crystal display (TFT-LCD), comprising:
    a patterned copper layer formed on a substrate; and
    a barrier layer, formed on the patterned copper layer, and the barrier layer comprising an alloy of $M_1M_2R$ wherein $M_1$ is cobalt (Co) or molybdenum (Mo), $M_2$ is molybdenum (Mo), rhenium (Re) or vanadium (V), and R is boron (B) or phosphorus (P).

12. The copper gate electrode according to claim 11, wherein the barrier layer has a thickness ranged from about 5 nm to about 50 nm.

* * * * *